(12) United States Patent
Mao et al.

(10) Patent No.: US 9,117,949 B2
(45) Date of Patent: Aug. 25, 2015

(54) STRUCTURE AND FABRICATION METHOD OF A HIGH PERFORMANCE MEMS THERMOPILE IR DETECTOR

(71) Applicant: JIANGSU R&D CENTER FOR INTERNET OF THINGS, Wuxi (CN)

(72) Inventors: Haiyang Mao, Wuxi (CN); Wen Ou, Wuxi (CN)

(73) Assignee: JIANGSU R&D CENTER FOR INTERNET OF THINGS, Wuxi (CN)

( * ) Notice: Subject to any disclaimer, the term of this patent is extended or adjusted under 35 U.S.C. 154(b) by 0 days.

(21) Appl. No.: 14/412,404

(22) PCT Filed: Jan. 21, 2013

(86) PCT No.: PCT/CN2013/000064
§ 371 (c)(1),
(2) Date: Dec. 31, 2014

(87) PCT Pub. No.: WO2014/029189
PCT Pub. Date: Feb. 27, 2014

(65) Prior Publication Data
US 2015/0137304 A1    May 21, 2015

(30) Foreign Application Priority Data
Aug. 23, 2012  (CN) .......................... 2012 1 0303727

(51) Int. Cl.
*H01L 31/058*  (2006.01)
*H01L 31/0352*  (2006.01)
*G01J 5/12*  (2006.01)
*H01L 35/32*  (2006.01)
*G01J 5/02*  (2006.01)
*H01L 27/144*  (2006.01)
*H01L 31/028*  (2006.01)
*H01L 31/18*  (2006.01)

(52) U.S. Cl.
CPC ............ *H01L 31/0352* (2013.01); *G01J 5/022* (2013.01); *G01J 5/12* (2013.01); *H01L 27/1443* (2013.01); *H01L 27/1446* (2013.01); *H01L 31/028* (2013.01); *H01L 31/1804* (2013.01); *H01L 35/32* (2013.01)

(58) Field of Classification Search
USPC ....................................... 250/338.1; 257/467
See application file for complete search history.

(56) References Cited

U.S. PATENT DOCUMENTS

2003/0148620 A1* 8/2003 Chavan et al. ................ 438/706
2015/0168221 A1* 6/2015 Mao et al. ..................... 257/467

*Primary Examiner* — Daniel Whalen
(74) *Attorney, Agent, or Firm* — Anova Law Group, PLLC

(57) ABSTRACT

The invention involves structure and fabrication method of a high performance IR detector. The structure comprises a substrate; a releasing barrier band on the substrate; a thermal isolation chamber constructed by the releasing barrier band; a black silicon-based IR absorber located right above the thermal isolation chamber and the black silicon-based IR absorber is set on the releasing barrier band; a number of thermocouples are set around the lateral sides of the black silicon-based IR absorber. The thermopiles around the black silicon-based IR absorber are electrically connected in series. The cold junctions of the thermopile are connected to the substrate through the first thermal-conductive-electrical-isolated structures as well as the heat conductor under the first thermal-conductive-electrical-isolated structures. The hot junctions of the thermopile are in contact with the IR absorber through the second thermal-conductive-electrical-isolated structures, and the second thermal-conductive-electrical-isolated structures are located above the releasing barrier band. The structure of such detector is simple, and it is easy to implement and can also be monolithicly integrated. Such detector has high responsivity and detection rate, and is CMOS-compatible, thus can be used widely in a safe and reliable manner.

10 Claims, 6 Drawing Sheets

STRUCTURE AND FABRICATION METHOD OF A HIGH PERFORMANCE MEMS THERMOPILE IR DETECTOR

FIELD OF THE INVENTION

The invention involves structure and fabrication method of an infrared (IR) detector, especially the structure and fabrication method of a high-performance MEMS thermopile IR detector, and, in detail, the structure and fabrication method of one type of high-performance thermopile IR detector based on black silicon. The invention belongs to the technical field of MEMS.

BACKGROUND

MEMS thermopile IR detector is a typical device in the field of sensing detection and one of the core components for constituting temperature sensor, root-mean-square converter, gas sensor, thermal flow meter and other detectors. Moreover, small size thermopile IR detector can also be used for constructing IR focal plane arrays (FPA) and thus realizing IR imaging. Compared with IR detectors based on other operating principles (such as pyroelectric IR detectors and thermistor IR detectors etc.), thermopile IR detector has obvious comprehensive benefits of measurable constant radiant quantity, having no need to apply bias voltage or use chopper, and being more applicable to mobile applications and field applications. Thus, MEMS thermopile IR detector has an important significance for achieving broader IR detection applications. It has broad civilian and military prospects, and it also has enormous business value and market potential. Research and development of the MEMS thermopile IR detector has become a newly high-tech industry growth point for the $21^{st}$ century. It can be predicted that MEMS thermopile IR detector will become a more widely used device in many aspects of sensing detection. In particular, as MEMS technology, including device design, manufacturing, packaging, testing and other techniques are becoming increasingly sophisticated, MEMS thermopile IR detector will have a more important position in this field.

Responsivity and detection rate are two important performance parameters for describing IR detector and determining its potential applications in different fields, of which responsivity is the ratio of electrical output and incident IR radiation power, indicating the sensitivity of the IR detector responding to IR radiation. Responsivity affects the value of the detection rate greatly. For a thermopile IR detector, the temperature difference between the hot junctions and cold junctions of the thermocouple strips is an important parameter reflecting the responsivity and detection rate of the device. In order to increase the temperature difference and thereby improve performance of the device, the temperature of the cold junctions is usually maintained to be consistent with that of the substrate. Meanwhile, the hot junctions should be able to effectively transfer the heat absorbed by the IR absorber to the thermocouples. To achieve this effect, realization of heat-conducting structures between cold junctions and substrate as well as between hot junctions and IR absorber is necessary, considering the electrical series connection among thermocouples. The heat-conducting structures shall also have the function of electrical isolation. The reported thermopile IR detectors mainly use their substrates as heat sinks, where the cold junctions of the thermocouples usually overlap directly with the substrates while the hot junctions overlap directly with the absorbers. As the materials of the substrates and the absorbers are conductive to some extent, such a direct overlapping method may influence the output signals of the thermopile IR detectors and ultimately affect device performance.

For thermopile IR detector with fixed structural types (including thermal-conductive-electrical-isolated structures), dimensions, thermocouple materials and other parameters, the values of its responsivity and detection rate shall depend on the absorption efficiency of their IR absorber. In research of IR detectors, silicon nitride films are often used as IR absorbers. However, in wavelength range of 1-12 μm, the average IR absorption efficiency that can be obtained from silicon nitride is only about 35%. Besides, the thermopile IR detector with silicon nitride-based IR absorber cannot get a high responsivity and detection rate. In view of this, to improve the responsivity and detection rate, it is necessary to increase the absorption efficiency of the IR absorber. In study of the IR detectors over the past few decades, researchers have developed a variety of materials or structures with high absorption and can be used as IR absorbers, among which, gold-black has excellent IR absorption effect due to its nanoscale rough surfaces and is an extremely popular material in research of IR detectors because of its low thermal capacity. When using the material of gold-black as IR absorber, the responsivity and detection rate of the devices can be increased accordingly. However, the preparation of gold-black involves metal evaporation, metallic nano-particle agglutination and other complicated processes. Moreover, its compatibility with the CMOS process is poor and generally can only be produced on structure surfaces after completing process of device structures. In view of this, the mass production of detectors with gold-black as the absorber is limited. ¼-wavelength resonant structures make use of the resonance effect generated when the thickness of the dielectric layer matches the ¼-wavelength of incident IR light to maximize the absorption efficiency of the IR absorber. However, constrained by the resonance condition, detectors using ¼-wavelength resonant structures as absorbers are only sensitive to IR radiation of certain central wavelengths. In addition, the processing requirements for preparation of ¼-wavelength resonant structures are extremely strict. If the dielectric layer thickness and wavelength are slightly unmatched, the IR absorption efficiency will be subject to great attenuation.

Black silicon has a kind of large area forest-like nano-pillar/needle structure. It was once deemed to be a revolutionary new material in electronics industry. Compared with the material of conventional silicon, black silicon has very high absorption efficiency for near-IR light. At present, a variety of methods for preparing black silicon have been proposed, such as high energy femtosecond laser-assisted etching, metal catalysis electrochemical etching and plasma dry etching. Based on comprehensive consideration of processing costs, convenient level of technology, processing compatibility and other aspects, the method of plasma dry etching for preparing black silicon is most commonly used in conventional microfabrication. Researchers have reported the usage of black silicon as the material of IR absorber to improve the performance of thermopile IR detectors: after formation of the basic structure of a thermopile IR detector (including a supporting membrane, thermopile, metallic connection structures and so on), α-Si or Poly-Si layer is deposited on the surface by plasma enhanced chemical vapor deposition (PECVD) technology, high energy ion implantation is carried out, followed by incomplete dry etching. In this way, black silicon can be obtained from the silicon layer and can also be patterned in the IR absorber region. Finally, the device is released. In this method, incomplete etching is adopted for fabricating black silicon. Thus, the controllability over the shapes and sizes of the black silicon is low. For this method, in addition, before the preparation of black silicon, high energy ion implantation is needed for introducing defects in the silicon layer. This thereby increases the complexity of the process. Moreover, this method adopts the technical idea of "black silicon first, followed by structure release". Thus, it requires strict protection of black silicon from damage during the process of structure release. However, black silicon maintains physical and chemical properties of silicon material to some extent, and is vulnerable to etchant gas destruction during the subsequent $XeF_2$ dry release process; moreover, as the nanostructures in black silicon are with certain height and density, conventional methods such as membrane deposition or coating protection cannot achieve effective protection.

BRIEF SUMMARY OF THE DISCLOSURE

The purpose of this invention is to overcome the shortcomings of existing technologies and provide structure and fabrication method of a high-performance MEMS thermopile IR detector. The structure of such detector is simple, and it is easy to implement and can also be monolithically integrated. Such detector has high responsivity and detection rate, and is CMOS-compatible, thus can be used widely in a safe and reliable manner.

According to the technical solution provided by this invention, the MEMS thermopile IR detector with high performance is consist of a substrate; a releasing barrier band on the substrate; a thermal isolation chamber constructed by the releasing barrier band, which can function as an etching stop during the process of releasing the material of heat conductor to form the thermal isolation chamber; black silicon-based IR absorber right above the thermal isolation chamber and the black silicon-based IR absorber is set on the releasing barrier band; a number of thermopiles are set around the lateral sides of the black silicon-based IR absorber. The thermopiles around the black silicon-based IR absorber are electrically connected in series, and are equipped with metal electrodes for voltage output; one-side terminals of the thermopile adjacent to the IR absorber form the hot junctions and the other-side terminals far away from the IR absorber form the cold junctions; the cold junctions of the thermopile are connected to the substrate through the first thermal-conductive-electrical-isolated structures as well as the heat conductor under the first thermal-conductive-electrical-isolated structures, the heat conductor is located outside the thermal isolation chamber but between the releasing barrier band and the substrate; the first thermal-conductive-electrical-isolated structures are embedded in the releasing barrier band; the hot junctions of the thermopile are in contact with the IR absorber through the second thermal-conductive-electrical-isolated structures, and the second thermal-conductive-electrical-isolated structures are located above the releasing barrier band.

The black silicon-based IR absorber comprises black silicon structures formed from black silicon material through reactive ion etching (RIE) and releasing channels that run through the black silicon-based IR absorber. The releasing channels and the thermal isolation chamber are connected with each other.

The thermopile comprises P-type thermocouple strips and N-type thermocouple strips that correspond to the P-type thermocouple strips; the N-type thermocouple strips and P-type thermocouple strips are isolated from each other by means of the barrier isolation layer; the P-type thermocouple strips and N-type thermocouple strips are electrically connected through the first connecting lines at the terminals that form hot junctions; and at the terminals that form cold junctions, the P-type thermocouple strips and N-type thermocouple strips in the adjacent thermocouples are electrically connected through the second connecting lines. Hence, thermocouples are electrically connected with each other for forming a thermopile.

Materials for both the first thermal-conductive-electrical-isolated structures and the second thermal-conductive-electrical-isolated structures include $Si_3N_4$.

Metallic electrodes are set beside the serial-connected thermocouples around the lateral sides of the black silicon-based IR absorber.

The N-type thermocouple strips are under the P-type thermocouple strips, N-type thermocouple strips are above the releasing barrier band, the cold junctions of N-type thermocouple strips contact with the first thermal-conductive-electrical-isolated structures and then connect with heat conductor through the first thermal-conductive-electrical-isolated structures, the hot junctions of N-type thermocouple strips are bridging one-side terminals of the second thermal-conductive-electrical-isolated structures, and the other-side terminals of the second thermal-conductive-electrical-isolated structures are in contact with the black silicon-based IR absorber.

The fabrication of a high-performance MEMS thermopile IR detector, the fabrication consists of the following steps:

a. Providing a substrate and setting a substrate protective layer on the surface of the substrate.

b. Etching the substrate protective layer selectively, so as to form substrate contacting windows above the substrate. The substrate contacting windows run through the substrate protective layer.

c. Depositing a layer of heat conductor over the substrate contacting windows, and depositing a mask layer over the heat conductor. The heat conductor covers the substrate protective layer and fills in the substrate contacting windows.

d. Etching the heat-conductor mask layer selectively so as to form heat-conductor etching windows. The heat-conductor etching windows run through the heat-conductor mask layer along the inner sides of the substrate contacting windows. Using the heat-conductor etching windows to etch the heat conductor till reaching the substrate protective layer thus to form heat-conductor through-holes.

e. Depositing a supporting layer on the heat-conductor mask layer, making the supporting layer fill in the heat-conductor through-holes and heat-conductor etching windows, and also cover the heat-conductor mask layer so as to form a releasing barrier band and the supporting membrane over the substrate.

f. Etching the supporting layer selectively so as to form thermal-conductive-electrical-isolated openings within the supporting layer. The thermal-conductive-electrical-isolated openings run through the supporting layer and locate at the lateral sides of the releasing barrier band. Depositing to form a thermal-conductive-electrical-isolated layer over the supporting layer. The thermal-conductive-electrical-isolated layer fills in the thermal-conductive-electrical-isolated openings, and covers the supporting layer.

g. Etching the thermal-conductive-electrical-isolated layer selectively, so as to form the first thermal-conductive-electrical-isolated blocks and the second thermal-conductive-electrical-isolated blocks over the above mentioned supporting layer. The first thermal-conductive-electrical-isolated blocks are within the supporting layer and the second thermal-conductive-electrical-isolated blocks are over the supporting layer.

h. Setting the first thermocouple strips and the second thermocouple strips within the region between the first thermal-conductive-electrical-isolated blocks and the second thermal-conductive-electrical-isolated blocks close to the first ones. The implantation types for the first thermocouple strips and the second thermocouple strips are different. The first thermocouple strips and the second thermocouple strips are isolated from each other by the barrier isolating layer. The terminals at one side of the first thermocouple strips are in contact with the first thermal-conductive-electrical-isolated blocks and the other terminals are in contact with the second thermal-conductive-electrical-isolated blocks.

i. A thermocouple protective layer is set over the second thermocouple strips, the region covered by the thermocouple protective layer consists of the second thermocouple strips and the first thermal-conductive-electrical-isolated blocks; the black silicon material is formed within the region constructed by the second thermal-conductive-electrical-isolated blocks; and the black silicon material is in contact with the second thermal-conductive-electrical-isolated blocks;

j. Etching the thermocouple protective layer selectively, so as to form electrical-connection through-holes for purpose of connecting the first thermocouple strips and the second thermocouple strips.

k. Sputtering a metal layer on the substrate with produced electrical-connection through-holes. The metal layer shall be filled in the electrical-connection through-holes. Masking and etching the above mentioned metal layer selectively and making the first thermocouple strips be electrically connected to the second thermocouple strips at one-side terminals of the second thermal-conductive-electrical-isolated blocks through the first connecting lines; making the second thermocouple strips be electrically connected to the first thermocouple strips of the adjacent thermocouples at the other-side terminals of the first thermal-conductive-electrical-isolated blocks through the second connecting lines; forming the first electrical connectors at the lateral sides of the first thermal-conductive-electrical-isolated structures.

l. Depositing to form a passivation layer on the substrate on which the first connecting lines, the second connecting lines and the first electrical connectors have been produced. The passivation layer covers the black silicon material, the thermocouple protective layer, the first connecting line, the second connecting line and the first electrical connector.

m. Etching the passivation layer selectively, so as to form black silicon etching windows on the passivation layer over the black silicon material; etching the black silicon material with help of the black silicon etching windows, till reaching the heat conductor right under the black silicon etching windows to form releasing openings.

n. Releasing the heat conductor right under the black silicon material using the releasing barrier band as an etching stop, thus to obtain a thermal isolation chamber.

o. Using the passivation layer as the sidewall material for the black silicon material with rough surface; applying RIE on the black silicon material so as to form a black silicon-based IR absorber, and at the same time to form the second electrical connector.

In the above-mentioned steps of m and n, coating the inner walls of the releasing openings with a releasing barrier layer for protecting the black silicon material.

In the step h, the first thermocouple strips are N-type implanted and the second thermocouple strips are P-type implanted.

In the step k, the material of the metal layer includes Al.

The advantages of the invention include:

1. Black silicon-based IR absorber is used: due to the high absorption efficiency of the black silicon, high responsivity, high detection rate and other outstanding features of the device can be achieved, in this way, black silicon may overcome the poor responsivity and detection rate of detectors using $Si_3N_4$ as the material of the IR absorber.

2. There are no stringent requirements on the process parameters (such as thickness of $SiO_2$ and Poly-Si, etching time and etching thickness etc.) for preparing the black silicon. Therefore, the black silicon-based IR detector is easy to realize, and thus can overcome the defects of the detectors using ¼-wavelength resonant structures as absorbers, including the stringent requirements on process parameters and poor controllability of performance.

3. As black silicon may achieve very high IR absorption efficiency within a large wavelength range, such devices have a large applicable wavelength range and may overcome the defects of the detectors using ¼-wavelength resonant structure-based absorbers as being only applicable to certain central wavelengths.

4. The technical idea of "release first, followed by black silicon preparation" is used in the fabrication process of this invention, which effectively overcomes the problem of easily damaged black silicon structures with the method of "black silicon first, followed by structure release".

5. Design and fabrication of thermal-conductive-electrical-isolated structures are carried out respectively at the hot/cold junctions of the invented detector, which may further improve the performance of the device.

6. Fabrication process of the detector is fully compatible with CMOS process, which is conducive to monolithic integration of the detector structure with circuit.

7. The novel MEMS thermopile IR detector with high performance presented in this invention has features of excellent processing compatibility with CMOS fabrication, easy realization of device structure, easy monolithic integration with circuit, high responsivity and detection rate, and also can be widely and practically used in temperature sensors, gas sensors, thermal flow meters and other sensing devices and systems.

BRIEF DESCRIPTION OF THE DRAWINGS

FIG. 1 shows the section view of this invention after the substrate protective layer is formed on the substrate;

FIG. 2 shows the section view of this invention after the substrate contacting windows are formed;

FIG. 3 shows the section view of this invention after the heat-conductor mask layer is formed;

FIG. 4 shows the section view of this invention after the heat-conductor through-holes are formed in the heat conductor;

FIG. 5 shows the section view of this invention after the releasing barrier band structure is formed;

FIG. 6 shows the section view of this invention after the thermal-conductive-electrical-isolated layer is formed;

FIG. 7 shows the section view of this invention after the first thermal-conductive-electrical-isolated blocks and the second thermal-conductive-electrical-isolated blocks are formed;

FIG. 8 shows the section view of this invention after the first thermocouple strips and second thermocouple strips are formed;

FIG. 9 shows the section view of this invention after the black silicon material is deposited;

FIG. 10 shows the section view of this invention after electrical-connection through-holes are formed;

FIG. 11 shows the section view of this invention after the first connecting lines, the second connecting lines as well as the first electrical connectors are formed;

FIG. 12 shows the section view of this invention after the passivation layer is deposited;

FIG. 13 shows the section view of this invention after releasing openings are formed and the inner walls of which are coated with a releasing barrier layer;

FIG. 14 shows the section view of this invention after thermal isolation chamber is formed by releasing the heat conductor;

FIG. 15 shows the section view of this invention after the black silicon-based IR absorber is formed;

Illustration of marks in figures:

1—The first thermal-conductive-electrical-isolated structures, 2—Releasing barrier band, 3—N-type thermocouple strips, 4—P-type thermocouple strips, 5—The second thermal-conductive-electrical-isolated structures, 6—Releasing channels, 7—Black silicon-based IR absorber, 8—Connecting lines among thermal-detection structures, 9—Electrodes, 101—Substrate, 102—Substrate protective layer, 202—Substrate contacting windows, 302—Heat-conductor fill-in structures, 303—Heat conductor, 304—Heat-conductor mask layer, 403—Heat-conductor through-holes, 404—Heat-conductor etching windows, 503—Releasing barrier band structure, 504—Supporting membrane, 505—Supporting layer, 605—Thermal-conductive-electrical-isolated openings, 606—Thermal-conductive-electrical-isolated layer, 705—The first thermal-conductive-electrical-isolated blocks, 706—The second thermal-conductive-electrical-isolated blocks, 807—The first thermocouple strips, 808—Barrier isolation layer, 809—The second thermocouple strips, 810—Hot junctions, 908—Thermocouple protective layer, 909—Black silicon material, 910-Bridging region, 1008—Electrical-connection through-holes, 1109—The first connecting lines, 1110—The first electrical connectors, 1111—The second connecting lines, 1211—Passivation layer, 1309—Releasing openings, 1311—Black silicon etching windows, 1312—Releasing barrier layer, 1403—Thermal isolation chamber, 1412—Black silicon releasing barrier layer, 1509—Black silicon structure and 1510—The second electrical connectors.

DETAILED DESCRIPTION

The invention will be further described with accompanying specific drawings and embodiments.

Figure 17:
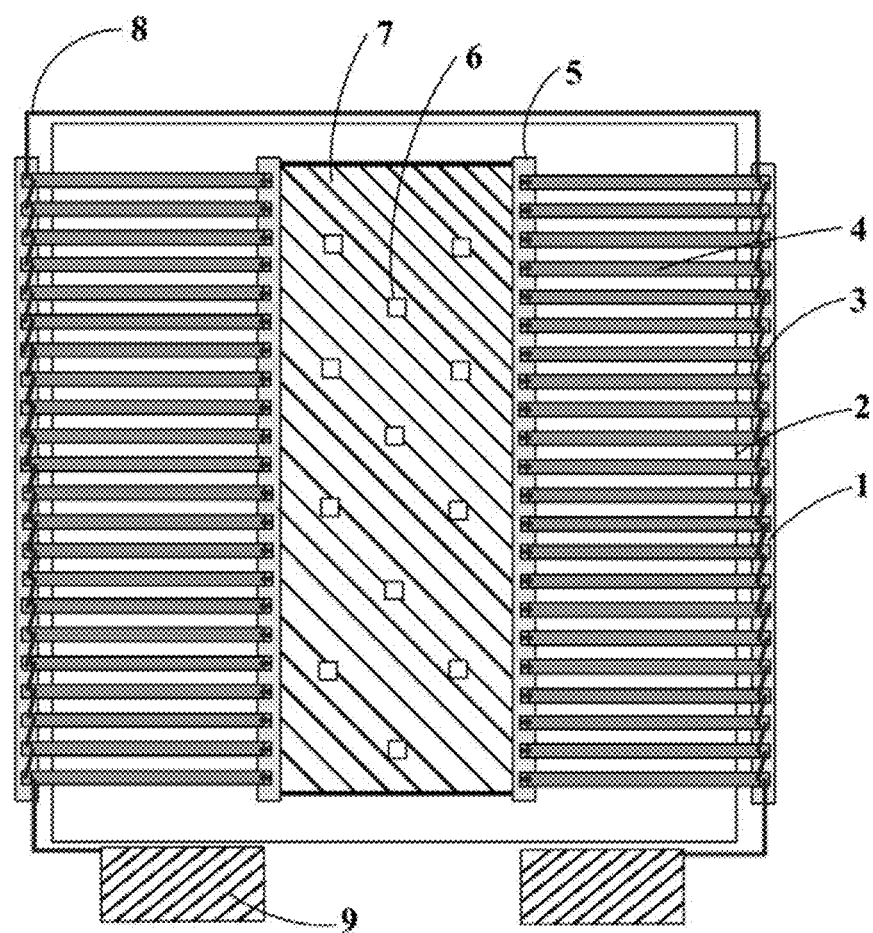
FIG. 17 shows the structure diagram of this invention.

As shown in FIG. 17: the MEMS thermopile IR detector with high performance consists of a substrate 101; a releasing barrier band 2 on the substrate 101; a thermal isolation chamber 1403 constructed by the releasing barrier band 2, which can function as an etching stop during the process of releasing the material of heat conductor to form the thermal isolation chamber 1403; a black silicon-based IR absorber 7 right above the thermal isolation chamber 1403 and the black silicon-based IR absorber 7 is set above the releasing barrier band 2; a number of thermocouples are set around the lateral sides of the black silicon-based IR absorber 7.

The thermocouples around the black silicon-based IR absorber 7 are electrically connected in series. In one embodiment, the black silicon-based IR absorber 7 is rectangular, thermopiles are symmetrically set on two lateral sides of the black silicon-based IR absorber 7, and they are electrically connected in series through the connecting lines among thermal-detection structures 8.

The terminals of the thermopile adjacent to the IR absorber form the hot junctions 810 and the terminals far away from the IR absorber form the cold junctions; the cold junctions of the thermopile are connected to the substrate through the first thermal-conductive-electrical-isolated structures 1 as well as the heat conductor 303 under the first thermal-conductive-electrical-isolated structures 1, the heat conductor 303 is located outside the thermal isolation chamber 1403 but between the releasing barrier band 2 and the substrate 101; the first thermal-conductive-electrical-isolated structures 1 is embedded in the releasing barrier band 2; the hot junctions of the thermopile are in contact with the IR absorber through the second thermal-conductive-electrical-isolated structures 5, and the second thermal-conductive-electrical-isolated structures 5 are located on the releasing barrier band 2. In addition, the black silicon-based IR absorber 7 can be of any shapes as needed, such as square, rectangular, circular, square shape, complex shapes, etc.

In one embodiment, the black silicon-based IR absorber 7 comprises black silicon structures 1509 and releasing channels 6 that run through the IR absorber. The black silicon structures 1509 are produced from black silicon material 909 by making use of the feature that the rough surfaces of Poly-Si can be utilized as sidewall supporters in highly selective anisotropic etching process. The releasing channels 6 and thermal isolation chamber 1403 are interconnected. Electrically connected electrodes 9 are set on thermal detection structures on lateral sides of the black silicon-based IR absorber 7. Electrodes 9 are used to output voltage signals of heat detected by thermopile. The heat absorbed by the black silicon-based IR absorber 7 can be reflected based on changes in voltage signals.

The thermopiles are consist of the P-type thermocouple strips 4 and the N-type thermocouple strips 3 corresponding to the P-type thermocouple strips 4; the N-type thermocouple strips 3 and P-type thermocouple strips 4 are isolated by a barrier isolation layer 808; the P-type thermocouple strips 4 are electrically connected to the hot junctions 810 of the N-type thermocouple strips 3 through the first connecting lines 1109, and at the cold junctions, the P-type thermocouple strips 4 are electrically connected to the N-type thermocouple strips 3 in adjacent thermocouples through the second connecting lines 1111, thus all thermocouple strips in the thermopile are electrically connected.

Figure 15:
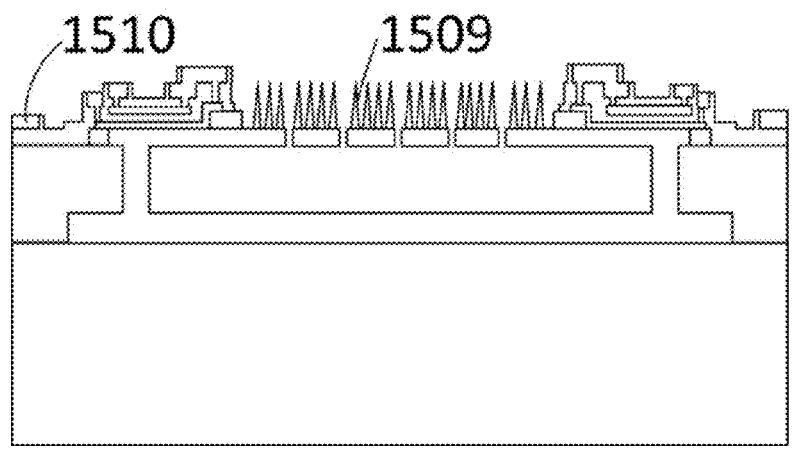

As shown in FIG. 15: in one embodiment, the N-type thermocouple strips 3 are under the P-type thermocouple strips 4. the N-type thermocouple strips 3 are above the releasing barrier band 2, the cold junctions of the N-type thermocouple strips 3 contact with the first thermal-conductive-electrical-isolated structures 1 and then connect with heat conductor 303 through the first thermal-conductive-electrical-isolated structures 1; the hot junctions of N-type thermocouple strips 3 are bridging one-side terminals of the second thermal-conductive-electrical-isolated structures 5, and the other-side terminals of the second thermal-conductive-electrical-isolated 5 structures are in contact with the black silicon-based IR absorber 7.

The releasing barrier band 2 in FIG. 17 corresponds to the releasing barrier band structure 503 in FIG. 15, the first thermal-conductive-electrical-isolated structures 1 correspond to the first thermal-conductive-electrical-isolated blocks 705 and the second thermal-conductive-electrical-isolated structures 5 correspond to the second thermal-conductive-electrical-isolated blocks 706.

As shown in FIG. 1 to FIG. 15: the described structure of the thermopile IR detector can be achieved using the following process steps. In certain embodiments, if there is no special requirement, the process steps can use any proper methods, the reagents and materials can be obtained commercially. More specifically, the process includes:

a. Providing a substrate 101 and setting a substrate protective layer 102 on the surface of the substrate 101.

Figure 1:
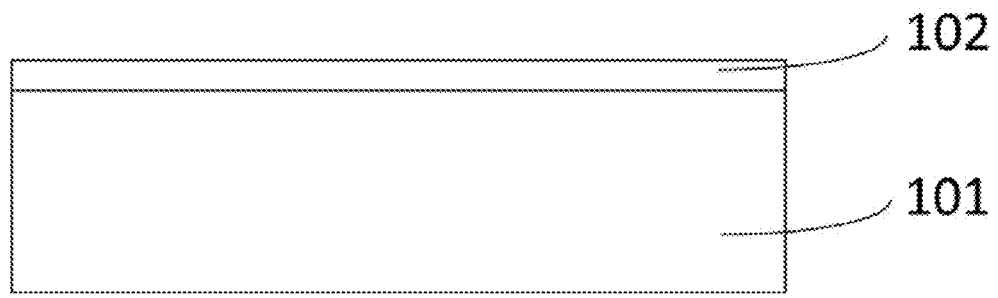
FIGS. 1 to 15 show the section views of specific processing steps for this invention and more specifically.

As shown in FIG. 1, grow a $SiO_2$ layer on surface of the substrate 101 by means of dry-oxygen oxidation to form a substrate protective layer 102 with a thickness of 5000 Å. The temperature of the dry-oxygen oxidation is 950° C. and the oxygen content is 60%. The substrate 101 adopts conventional materials including silicon.

b. Etching the substrate protective layer 102 selectively, so as to form substrate contacting windows 202 above the substrate 101. The substrate contacting windows 202 run through the substrate protective layer 102.

Figure 2:
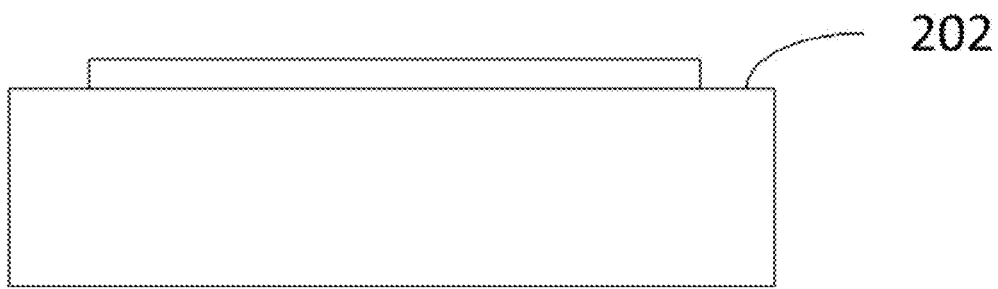
Figure 3:
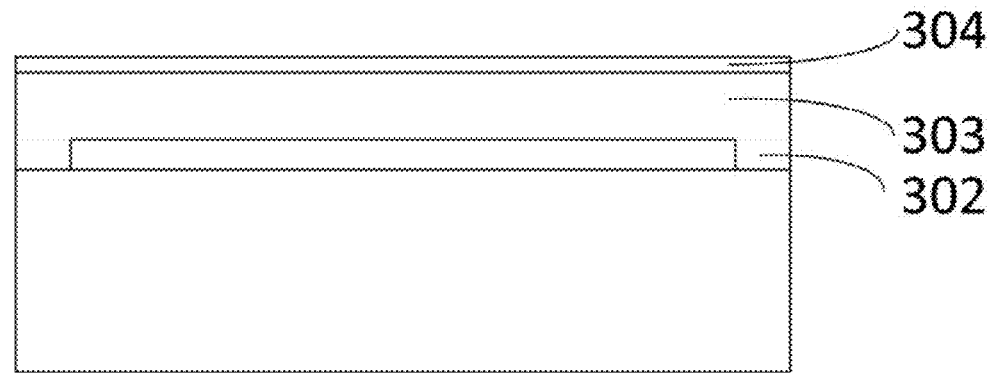

As shown in FIG. 2: spin-coat a photoresist layer on the surface of substrate protective layer 102, pattern the photoresist layer to form several openings at positions where cold junctions of the thermocouple strips will be produced. The width of the openings shall be 16 μm, the length of each opening shall be 35 μm and the total length shall be about 500 μm. Apply RIE to anisotropically etch the substrate protective layer 102, and transfer the opening patterns on the photoresist to the substrate protective layer 102, thus to form substrate contacting windows 202. Use the method of oxygen-plasma-stripping-of-photoresist together with sulfuric acid/hydrogen peroxide wet-cleaning-of-photoresist to remove photoresist on the wafer surface. Herein, the RF power of RIE for etching the substrate protective layer 102 is 300 W, the chamber pressure is 200 mTorr, the etching gas is a mixture of $CF_4$, $CHF_3$ and He, the flowing rates of which are 10/50/12 sccm (standard-state cubic centimeter per minute), respectively.

c. Depositing a layer of heat conductor 303 over the substrate contacting windows 202, and depositing a mask layer over the heat conductor 303. The heat-conductor mask layer 304 covers the substrate protective layer 102 and fills in the substrate contacting windows 202;

As shown in FIG. 3, apply LPCVD (low pressure chemical vapor deposition) technology to form heat conductor 303 and a heat-conductor mask layer 304 on the substrate protective layer 102 with substrate contacting windows 202, where the material of heat conductor 303 is Poly-Si and the material of heat-conductor mask layer 304 is $SiO_2$. Herein, the thickness of the heat conductor 303 is 2 μm, the thickness of the heat-conductor mask layer 304 is 2000 Å. The thickness of heat conductor 303 is significantly greater than that of the substrate protective layer 102, thus the heat conductor 303 may completely fill the substrate contacting windows 202 and form heat-conductor fill-in structures 302 at positions of the substrate contacting windows 202. Herein, the furnace temperature for LPCVD of the heat conductor 303 is 620° C., the pressure is 200 mTorr and the flowing rate of $SiH_4$ is 130 sccm. For LPCVD of the heat-conductor mask layer 304, TEOS (Tetraethyl Orthosilicate) source at temperature of 50° C. is used, the furnace temperature is 720° C., pressure is 300 mTorr and the flowing rate of oxygen is 200 sccm.

d. Etching the heat-conductor mask layer 304 selectively so as to form heat-conductor etching windows 404. The heat-conductor etching windows 404 run through the heat-conductor mask layer 304 along the inner sides of the substrate contacting windows 202. Use the heat-conductor etching windows 404 to etch the heat conductor 303 till reaching the substrate protective layer 102 thus to form heat-conductor through-holes 403.

Figure 4:
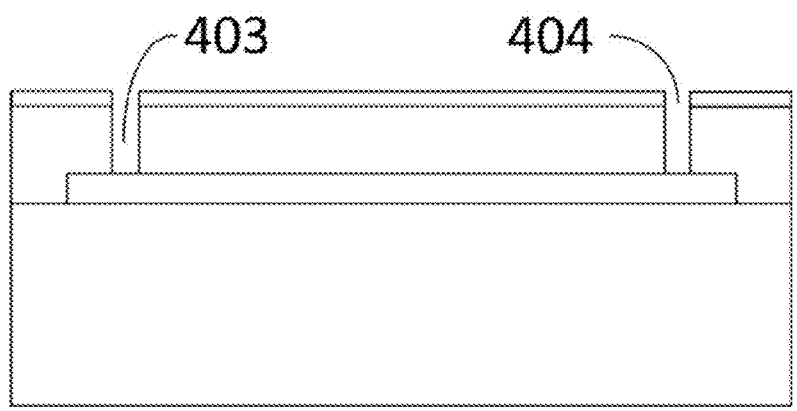

As shown in FIG. 4, spin-coat a photoresist layer on the surface of heat-conductor mask layer 304, pattern the photoresist layer to form rectangularly-closed ring-openings. Apply RIE to anisotropically etch the heat-conductor mask layer 304, and transfer the opening patterns on the photoresist to the heat-conductor mask layer 304, thus to form rectangularly-closed rings on the heat-conductor mask layer 304, namely the heat-conductor etching windows 404. Use the method of oxygen-plasma-stripping-of-photoresist together with sulfuric acid/hydrogen peroxide wet-cleaning-of-photoresist to remove photoresist on the wafer surface. Later on, apply RIE to anisotropically etch the heat conductor 303, transfer the opening patterns on heat-conductor mask layer 304 to the heat conductor 303, thus to form rectangularly-closed ring-opening patterns on heat conductor 303, namely heat-conductor through-holes 403. The width of the heat-conductor through-holes shall be 1 μm. Wherein, the etching gas used for anisotropically etching the heat conductor 303 is a mixture of $Cl_2$ and He, and the flowing rates of which are 180 sccm and 400 sccm, respectively, the RF power is 350 W and chamber pressure is 400 mTorr.

e. Depositing a supporting layer 505 on the heat-conductor mask layer 304, making the supporting layer 505 fill in the heat-conductor through-holes 403 and heat-conductor etching windows 404, and also cover the heat-conductor mask layer 304 so as to form a releasing barrier band structure 503 and the supporting membrane 504 above the substrate 101.

Figure 5:
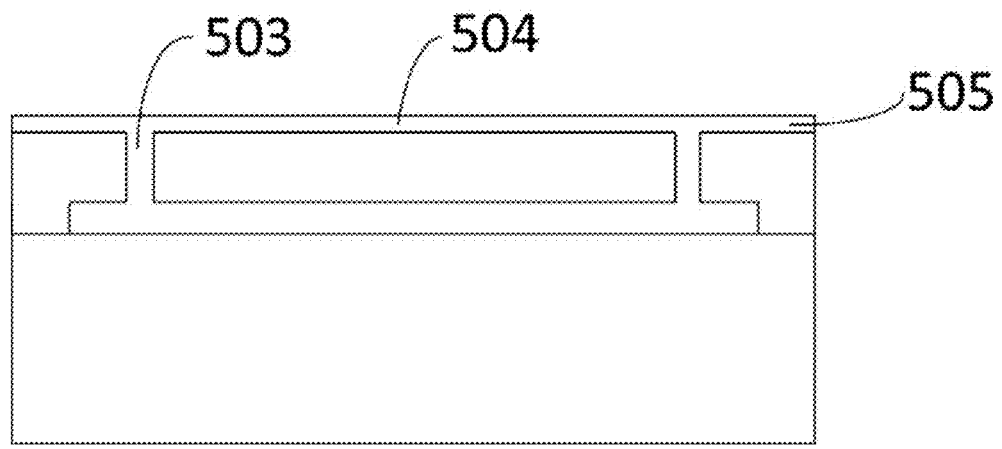

As shown in FIG. 5, deposit to form a supporting layer 505 on the substrate 101 with produced heat-conductor through-holes 403 and heat-conductor etching windows 404, by using LPCVD technology. The supporting layer 505 is $SiO_2$. The thickness of the supporting layer 505 is 8000 Å. The supporting layer 505 may completely fill the heat-conductor through-holes 403 and heat-conductor etching windows 404, thus to form a $SiO_2$ releasing barrier band structure 503, as well as a supporting membrane 504. Herein, the releasing barrier band structure 503 corresponds to the releasing barrier band 2 in FIG. 17, and is subsequently used to form the releasing barrier band 2.

f. Etching the supporting layer 505 selectively so as to form thermal-conductive-electrical-isolated openings 605 within the supporting layer 505. The thermal-conductive-electrical-isolated openings 605 run through the supporting layer 505 and locate at the lateral side of the releasing barrier band structure 503. Deposit to form a thermal-conductive-electrical-isolated layer 606 over the supporting layer 505. The thermal-conductive-electrical-isolated layer 606 fills in the thermal-conductive-electrical-isolated openings 605, and covers the supporting layer 505.

Figure 6:
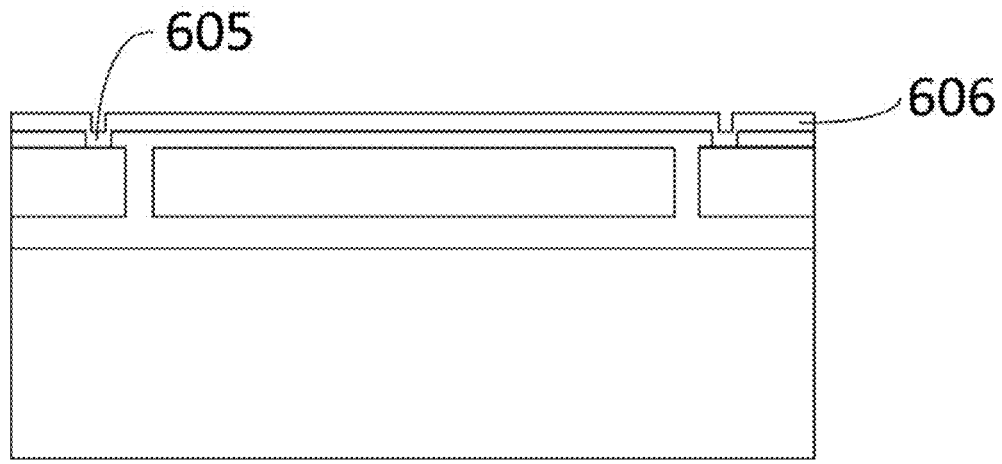

As shown in FIG. 6, spin-coat a photoresist layer on the supporting layer 505, pattern the photoresist layer to form several openings at positions where cold junctions of the thermocouple strips will be produced. The width of the openings shall be 15 μm, and the length of each opening shall be 35 μm. Apply RIE $SiO_2$ to anisotropically transfer the opening patterns on the photoresist layer to the supporting layer 505, thus to form thermal-conductive-electrical-isolated openings 605. Use the method of oxygen-plasma-stripping-of-photoresist together with sulfuric acid/hydrogen peroxide wet-cleaning-of-photoresist to remove photoresist on the wafer surface. Later on, deposit to form a thermal-conductive-electrical-isolated layer 606 on the supporting layer 505 by using LPCVD technology. Herein, the material of the thermal-conductive-electrical-isolated layer 606 is $Si_3N_4$ and its thickness is 8000 Å.

g. Etching the thermal-conductive-electrical-isolated layer 606 so as to form the first thermal-conductive-electrical-isolated blocks 705 and the second thermal-conductive-electrical-isolated blocks 706 at the position of the above mentioned supporting layer 505. The first thermal-conductive-electrical-isolated blocks 705 are within the supporting layer 505 and the second thermal-conductive-electrical-isolated blocks 706 are over the supporting layer 505.

Figure 7:
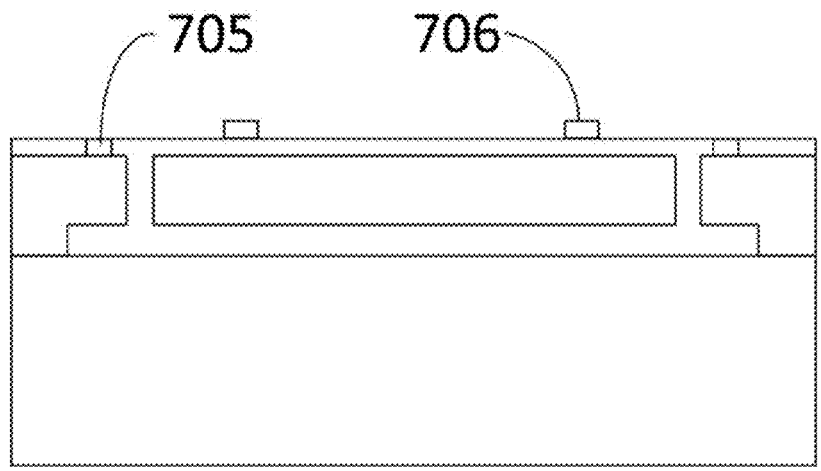

As shown in FIG. 7, spin-coat a photoresist layer on the thermal-conductive-electrical-isolated layer 606, pattern the photoresist layer to form several patterns at positions where cold junctions of the thermocouple strips will be produced. Apply RIE $Si_3N_4$ to anisotropically transfer the patterns on the photoresist layer to the thermal-conductive-electrical-isolated layer 606, thus to form the first thermal-conductive-electrical-isolated blocks 705 and the second thermal-conductive-electrical-isolated blocks 706, which correspond to the first thermal-conductive-electrical-isolated structures 1 and the second thermal-conductive-electrical-isolated structures 5 in FIG. 17. Herein, the width for each of the first thermal-conductive-electrical-isolated blocks 705 is 18 µm, the length is 50 µm, while those of the second thermal-conductive-electrical-isolated blocks 706 are 20 µm and 50 µm, respectively. Subsequently, use the method of oxygen-plasma-stripping-of-photoresist together with sulfuric acid/hydrogen peroxide wet-cleaning-of-photoresist to remove photoresist on the wafer surface. Wherein, the etching gas used for anisotropically etching $Si_3N_4$ is a mixture of $CHF_3$, He and $SF_6$, and the flowing rates of which are 7/100/30 sccm, respectively, the RF power is 150 W and chamber pressure is 400 mTorr.

h. Setting the first thermocouple strips 807 and the second thermocouple strips 809 between the first thermal-conductive-electrical-isolated blocks 705 and the second thermal-conductive-electrical-isolated blocks 706 close to them. The implantation types for the first thermocouple strips 807 and the second thermocouple strips 809 are different. The first thermocouple strips 807 and the second thermocouple strips 809 are isolated from each other by the barrier isolating layer 808. The terminals at one side of the first thermocouple strips 807 are in contact with the first thermal-conductive-electrical-isolated blocks 705 and the other-side terminals are in contact with the second thermal-conductive-electrical-isolated blocks 706.

Figure 8:
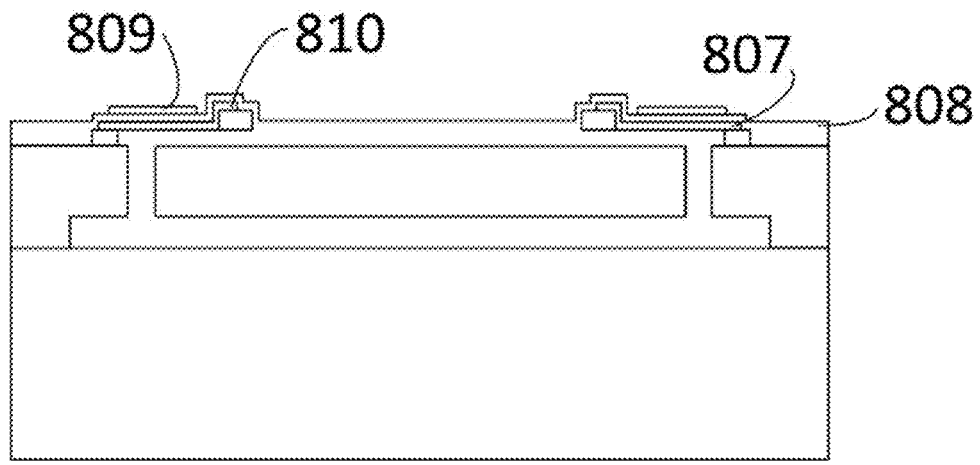

As shown in FIG. 8, deposit a Poly-Si layer with a thickness of 2000 Å on the substrate 101 with produced first thermal-conductive-electrical-isolated structures 1 and second thermal-conductive-electrical-isolated structures 5, by using LPCVD technology. Then, N-type implantation with doping concentration of $2.5e22$ $cm^{-3}$ and energy of 80 KeV is adopted on the Poly-Si layer.

Later on, deposit a barrier isolating layer 808 and a Poly-Si layer both with a thickness of 2000 Å on the N-type Poly-Si layer, by using LPCVD technology as well. Subsequently, P-type implantation with doping concentration of $5e22$ $cm^{-3}$ and energy of 30 KeV is adopted on the Poly-Si layer. Spin-coat a photoresist layer on the P-type Poly-Si layer, pattern the photoresist layer to form photoresist patterns at positions where N-type thermocouple strips 3 will be produced.

Herein, the material of the barrier isolation layer 808 is $SiO_2$. Apply RIE Poly-Si/$SiO_2$/Poly-Si to anisotropically transfer the photoresist patterns to the Poly-Si layer, $SiO_2$ layer and $SiO_2$ layer, respectively. In this process, the first thermocouple strips 807 are formed firstly, the cold junctions of which are connected to the first thermal-conductive-electrical-isolated blocks 705.

The hot junctions 810 of the first thermocouple strips 807 are bridging one halves of the second thermal-conductive-electrical-isolated blocks 706. The positions bridged between the hot junctions 810 of the first thermocouple strips 807 and the second thermal-conductive-electrical-isolated blocks 706 correspond to the positions covered by the subsequent thermocouple protective layer 908, namely, the positions bridged between the hot junctions 810 of the first thermocouple strips 807 and the second thermal-conductive-electrical-isolated blocks 706 can be set at random positions, provided that electrical isolation is achieved between the hot junctions 810 and subsequently formed black silicon-based IR absorber 7 by using the thermocouple protective layer 908 and the hot junctions 810 of the first thermocouple strips 807 and the second thermal-conductive-electrical-isolated blocks 706 are in contact.

Subsequently, use the method of oxygen-plasma-stripping-of-photoresist together with sulfuric acid/hydrogen peroxide wet-cleaning-of-photoresist to remove photoresist on the wafer surface. Spin-coat another photoresist layer on the P-type Poly-Si layer, and pattern it to form photoresist patterns at positions where thermopile will be produced. Apply RIE Poly-Si to anisotropically transfer the photoresist patterns to the P-type Poly-Si layer thus to form the second thermocouple strips 809.

Finally, use the method of oxygen-plasma-stripping-of-photoresist together with sulfuric acid/hydrogen peroxide wet-cleaning-of-photoresist to remove photoresist on the wafer surface. Herein, the width of the first thermocouple strips 807 and the second thermocouple strips 809 is 5 µm, the length of the first thermocouple strips 807 is 120 µm, the length of the second thermocouple strips 809 is 105 µm, the number of the thermocouples in the thermopile set within the area constructed by the first thermal-conductive-electrical-isolated blocks 705 and the second thermal-conductive-electrical-isolated blocks 706 is 96 and they shall be symmetrically arranged on both lateral sides of the rectangular absorber. While implementing the invention, the pairs of the thermocouples in the thermopile can be set at a random number based on practical needs, and not limited to the pair number and sizes as listed in the cases of the invention.

The first thermocouple strips 807 are in corresponding to the N-type thermocouple strips 3 in FIG. 17, the second thermocouple strips 809 are in corresponding to the P-type thermocouple strips 4; N-type thermocouple strips 3 and P-type thermocouple strips 4 come in pairs and form thermocouple structures. In the case of this invention, a thermocouple is constructed by one N-type thermocouple strip 3 and one P-type thermocouple strip 4, the P-type thermocouple strips 4 are set above the N-type thermocouple strips 3, the hot junctions of the N-type thermocouple strips 3 are connected to the second thermal-conductive-electrical-isolated structures 5 and the cold junctions of the N-type thermocouple strips 3 are connected to the substrate 101 through the first thermal-conductive-electrical-isolated structures 1 and heat conductor 303, so as to make the temperature at the cold junctions of the entire thermopile be consistent with that of the substrate 101. Electrical isolation is achieved by using the first thermal-conductive-electrical-isolated structures 1 and the second thermal-conductive-electrical-isolated structures 5.

i. A thermocouple protective layer 908 is set over the second thermocouple strips 809, the region covered by the thermocouple protective layer 908 consists of the second thermocouple strips 809 and the first thermal-conductive-electrical-isolated blocks 705; the black silicon material 909 is formed within the region constructed by the second thermal-conductive-electrical-isolated blocks 706; and the black silicon material 909 is in contact with the second thermal-conductive-electrical-isolated blocks 706.

Figure 9:
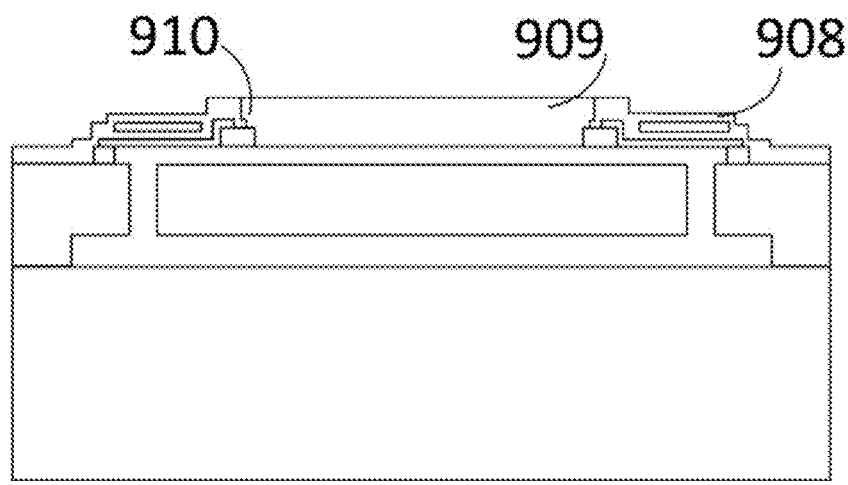

As shown in FIG. 9, deposit a SiO$_2$ layer with a thickness of 4000 Å above the substrate 101, which has the produced thermal detection structure, by using LPCVD technology as well. Subsequently, spin-coat a photoresist layer on the thermocouple protective layer 908, and pattern the photoresist layer to form patterns with large areas at positions where thermocouple strips will be produced. Apply RIE SiO$_2$ to anisotropically transfer the photoresist patterns to the SiO$_2$ layer to form the thermocouple protective layer 908.

Herein, the thermocouple protective layer 908 completely covers the first thermal-conductive-electrical-isolated structures 1 at the cold junctions of thermocouple strips while the second thermal-conductive-electrical-isolated structures 5 at the hot junctions of thermocouple strips are not completely covered by the thermocouple protective layer 908, with an exposed width of 10 μm. In one embodiment, the thermocouple protective layer 908 covers halves of the second thermal-conductive-electrical-isolated blocks 706, the second thermal-conductive-electrical-isolated blocks 706 are not completely covered by the thermocouple protective layer 908, mainly for assuring that the black silicon material 909 and the second thermal-conductive-electrical-isolated blocks 706 are in contact with each other and thus ensuring that the heat absorbed by the subsequently formed black silicon-based IR absorber 7 may be transferred to thermopile through the second thermal-conductive-electrical-isolated blocks 706. The area on the second thermal-conductive-electrical-isolated blocks 706 to be covered by thermocouple protective layer 908 can be set based on specific needs, on condition that the heat absorbed by the black silicon-based IR absorber 7 may be transferred to thermocouple through the second thermal-conductive-electrical-isolated blocks 706. Use the method of oxygen-plasma-stripping-of-photoresist together with sulfuric acid/hydrogen peroxide wet-cleaning-of-photoresist to remove photoresist on the wafer surface. Subsequently, deposit to form 2 μm-thick black silicon material 909 with Poly-Si as its material, by using LPCVD technology.

Later on, pattern the Poly-Si layer at the position of absorber. The black silicon material 909 patterns also bridge the second thermal-conductive-electrical-isolated structures 5 at the hot junctions of thermocouple strips, as shown in the bridging region 910 in the figure. Use the method of oxygen-plasma-stripping-of-photoresist together with sulfuric acid/hydrogen peroxide wet-cleaning-of-photoresist to remove photoresist on the wafer surface. In one embodiment, black silicon material 909 may also be obtained by means of deposition by applying the PECVD (plasma enhanced chemical vapor deposition) technology.

j. Etching the thermocouple protective layer 908 selectively, so as to form electrical-connection through-holes 1008 for purpose of connecting the first thermocouple strips 807 and the second thermocouple strips 809.

Figure 10:
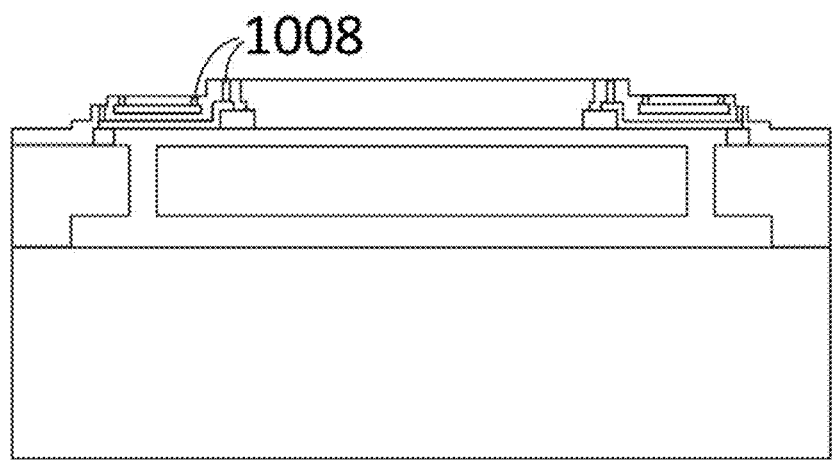

As shown in FIG. 10, spin-coat a photoresist layer on the surface of substrate 101, and pattern the photoresist layer to form several openings at positions where electrical-connection through-holes 1008 will be formed. Apply RIE SiO$_2$ to transfer the opening patterns on the photoresist layer to thermocouple protective layer 908 and form the opening patterns in thermocouple protective layer 908, namely, electrical-connection through-holes 1008. Finally, use the method of oxygen-plasma-stripping-of-photoresist together with sulfuric acid/hydrogen peroxide wet-cleaning-of-photoresist to remove photoresist on the wafer surface. The structural size of the formed electrical-connection through-holes 1008 is 1 μm×1 μm.

k. Sputtering a metal layer on the substrate 101 with produced electrical-connection through-holes 1008. The metal layer shall be filled in the electrical-connection through-holes 1008. Masking and etching the metal layer selectively and making the first thermocouple strips 807 be electrically connected to the second thermocouple strips 809 at one-side terminals of the second thermal-conductive-electrical-isolated blocks 706 through the first connecting lines 1109; making the second thermocouple strips 809 be electrically connected to the first thermocouple strips 807 of the adjacent thermocouple through the second connecting lines 1111; forming the first electrical connectors 1110 at the lateral sides of the first thermal-conductive-electrical-isolated structures 705.

Figure 11:
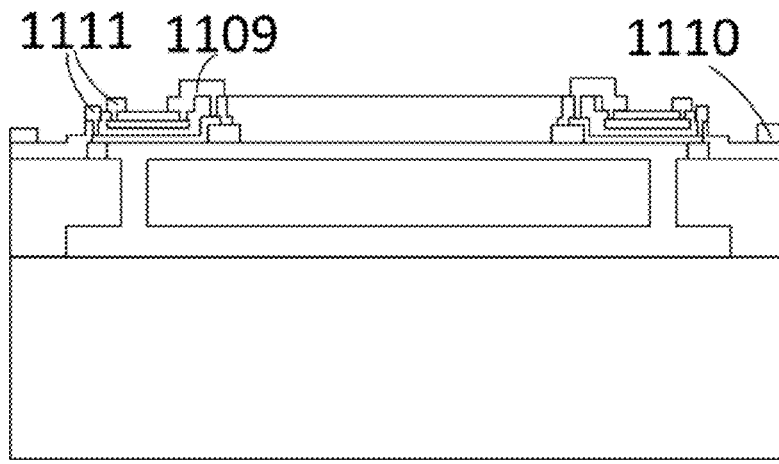

As shown in FIG. 11, sputter an Al metal layer on the substrate 101 with produced electrical-connection through-holes 1008, and form patterns at required positions for electrical-connection and metallic electrodes in the Al layer by photolithography, so as to form the first connecting lines 1109, the second connecting lines 1111 and the first electrical connectors 1110. Then remove photoresist on the wafer surface by means of organic cleaning Herein, the Al patterns are obtained by means of wet etching, of which the proportion of phosphoric acid (at a concentration of 60%-80%): acetic acid (at a concentration of 0.1%): nitric acid (at a concentration of 0.5%): water in the Al corrosive liquid is 16:1:1:2.

1. Depositing a passivation layer 1211 on the surface of the substrate 101, on which the first connecting lines 1109, the second connecting lines 1111 and the first electrical connectors 1110 have been produced. The passivation layer 1211 covers the black silicon material 909, the thermocouple protective layer, the first connecting lines 1109, the second connecting lines 1111 as well as the first electrical connectors 1110.

Figure 12:
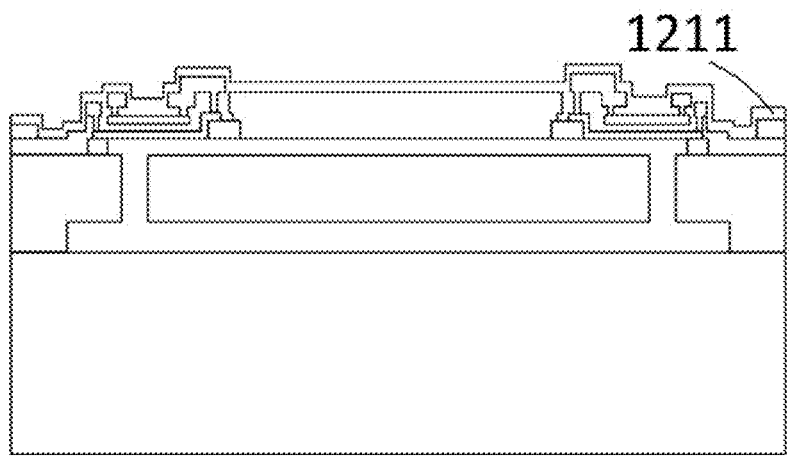

As shown in FIG. 12, deposit to form a 2000 Å-thick SiO$_2$ layer on the substrate 101 with produced metallic patterns, by applying PECVD technology thus to form a passivation layer 1211. Herein, the chamber temperature for PECVD the passivation layer is 270° C., the pressure is 250 mTorr, the concentration of SiH$_4$ is 4.6%, the flowing rate of N$_2$O is 150 sccm and the power is 103 W.

m. Etching the passivation layer 1211 selectively, so as to form black silicon etching windows 1311 on the passivation layer 1211 over the black silicon material 909; etching the black silicon material 909 with help of the black silicon etching windows 1311, till reaching heat conductor 303 right under the black silicon etching windows 1311 to form releasing openings 1309.

Figure 13:
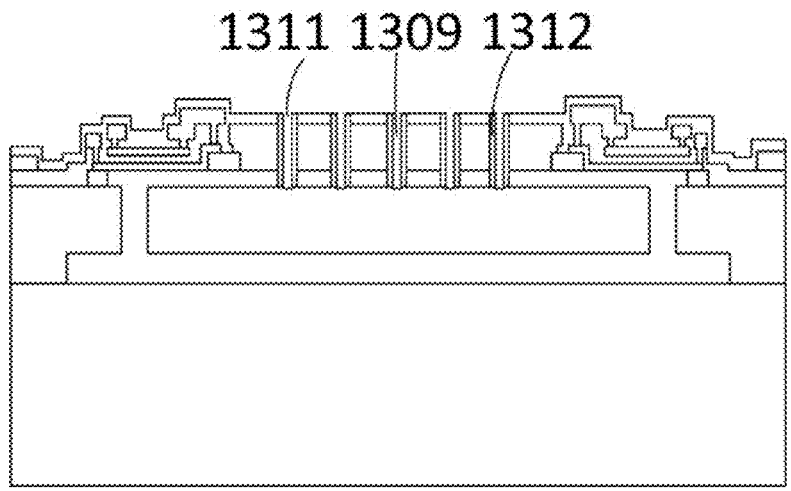

As shown in FIG. 13, spin-coat a photoresist layer on the passivation layer 1211, pattern the photoresist layer to form photoresist openings in the regions inside the absorber, the areas between every two thermocouples and the areas surrounded by the rectangularly-closed ring-openings (other than thermocouple-strip regions and absorber) by means of photolithography. Then, apply RIE SiO$_2$/Poly-Si/SiO$_2$ to transfer the photoresist opening patterns to different material layers, namely, to form releasing openings 1309 and black silicon etching windows 1311. In order to protect the Poly-Si within the region of absorber against damage caused by the releasing gas, a releasing barrier layer 1312 is coated around the inner sidewalls of the etching windows, by means of PECVD and photolithography. Herein, the material for the releasing barrier layer 1312 is photoresist, and the thickness of the releasing barrier layer 1312 is 2.5 μm. After the releasing barrier layer 1312 is coated, the releasing channels 6 become smaller. In one embodiment, the black silicon etching windows 1311 and the releasing openings 1309 form releasing channels 6 together.

n. Releasing heat conductor 303 right under the black silicon material 909 using the releasing barrier band structure 503 as an etching stop, thus to obtain a thermal isolation chamber 1403.

Figure 14:
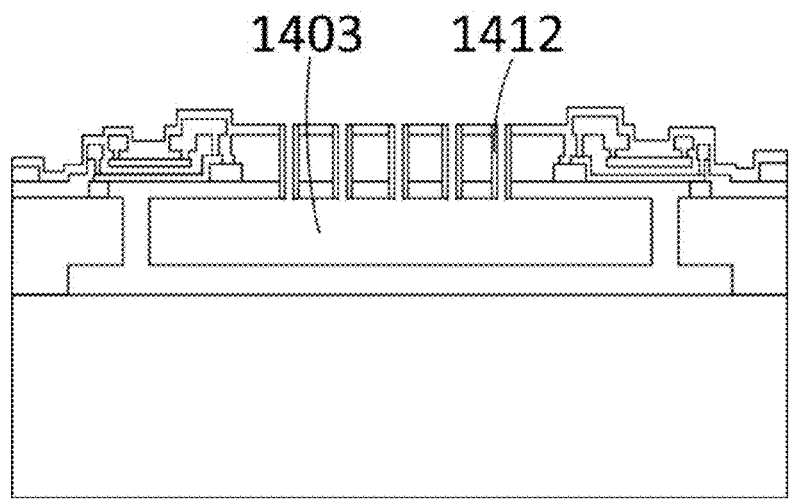

As shown in FIG. 14, as the material of heat conductor 303 is Poly-Si, thus $XeF_2$ dry etching method is adopted to isotropically etch the heat conductor 303 in the device structure, etch Poly-Si material of heat conductor 303 with help of the releasing channels 6 and thereby form a thermal isolation chamber 1403. The black silicon releasing barrier layer 1412 in FIG. 14 is in corresponding to the releasing barrier layer 1312 in FIG. 13.

o. Using the passivation layer 1211 as the sidewall material for the black silicon material 909 with rough surface; applying RIE on the black silicon material 909 so as to form black silicon-based IR absorber 7, and at the same time to form the second electrical connector 1510.

As shown in FIG. 15, make use of the features that the passivation layer 1211 which covers the rough black silicon material 909 can be adopted as sidewall material for the rough structures, by applying RIE Poly-Si technology only once, the black silicon structures 1509 can be produced. Herein, the black silicon structures 1509 are in the mophorlogies of nanoneedles or nanopillars. During the anisotropic etching, the passivation layer 1211 above the first electrical connectors 1110 are completely etched, thus the second electrical connectors 1510 are revealed. Finally, the novel MEMS thermopile IR detector with black silicon-based absorber 7 is obtained and its overall structure diagram is as shown in FIG. 17. In this invention, to prepare the black silicon-based IR absorber 7, the feature that the rough Poly-Si surfaces can be used as sidewall supporting structures in anisotropic etching with a high selectivity, is utilized. In this invention, black silicon material 909 layer (its material is Poly-Si) used for preparation of the black silicon-based IR absorber 7 can be obtained by means of PECVD or LPCVD technology.

Figure 16:
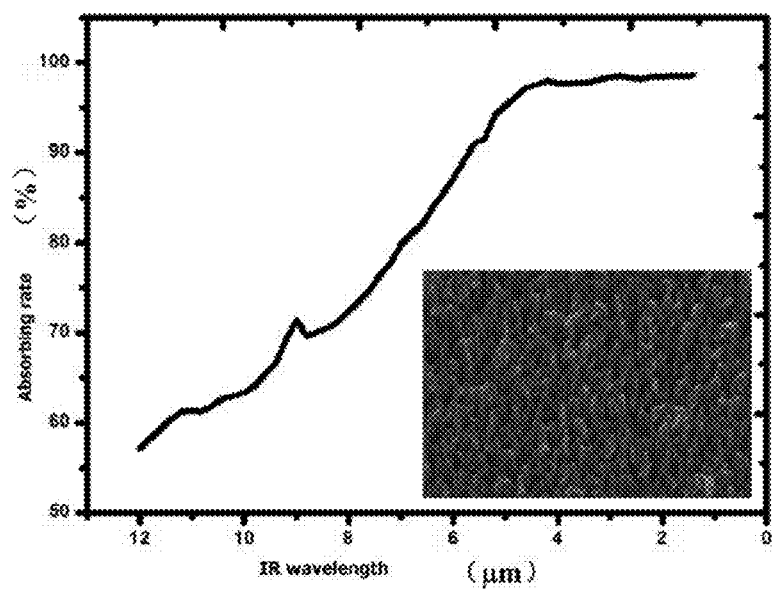
FIG. 16 shows scanning electron microscope image and IR absorption spectroscopy of the black silicon.

The scanning electron microscope images of the black silicon structures 1509 and their IR absorption spectroscopy are shown in FIG. 16. In one embodiment, the second electrical connectors 1510 are in corresponding to the first electrical connectors 1110 and the electrodes 9 in FIG. 17. Herein, the second electrical connectors 1510 are used to output the detection results of the entire thermopile IR detector.

For the thermopile IR detector obtained by the described method presented in this embodiment, the theoretical responsivity shall reach 249V/W, detection rate shall reach 2.25E8 $cmHz^{1/2}W^{-1}$, thermal response time shall be 15.3 ms and noise density shall be $35nV/Hz^{1/2}$.

As shown in FIGS. 1 to 17: To operate, the black silicon-based IR absorber 7 absorbs heat from IR incident light, and the absorbed heat is transferred to thermocouples on both lateral sides of black silicon-based IR absorber 7 through the second thermal-conductive-electrical-isolated structures 5. The cold junctions of thermopile are connected with the substrate 101 through the first thermal-conductive-electrical-isolated structures 1 as well as the heat conductor 303, so as to keep the temperature of cold junctions and that of the substrate 101 be consistent and achieve the effect of electrical isolation. A thermocouple is constructed by an N-type thermocouple strip 3 and a P-type thermocouple strip 4. After heat is absorbed by the hot junctions of the thermopile, temperature difference between the hot junctions and cold junctions will generate certain potential difference at the cold junctions. A number of thermocouples in the thermopile are connected in series and output voltage through the electrodes 9. Detection process can then be determined based on the output voltage.

Black silicon-based IR absorber is applied in this invention. Due to the high absorption efficiency of the black silicon, high responsivity, high detection rate and other outstanding features of the device can be achieved, black silicon may overcome the poor responsivity and detection rate of detectors using $Si_3N_4$ as the material of the IR absorber. There are no stringent requirements on the process parameters (such as thickness of $SiO_2$ and Poly-Si, etching time and etching thickness etc.) for preparing the black silicon. Therefore, the black silicon-based IR detector is easy to realize, and thus can overcome the defects of the detectors using ¼-wavelength resonant structures as absorbers, including the stringent requirements on process parameters and poor controllability of performance.

As black silicon may achieve very high IR absorption efficiency within large wavelength range, such devices have a large applicable wavelength range and may overcome the defects of the detectors using ¼-wavelength resonant structures as absorbers as being only applicable to certain central wavelengths. The technical idea of "release first, followed by black silicon preparation" is used in the preparation process of the present invention, effectively overcoming the problem of easily damaged black silicon structure in the technical method of "black silicon first, followed by structure release". Design and fabrication of thermal-conductive-electrical-isolated structures are carried out at the thermopile hot/cold junctions of the invented detector, which may further improve the performance of the device. Fabrication process of the detector is fully compatible with CMOS process, which is conducive to monolithic integration of the detector structure with circuit. The novel MEMS thermopile IR detector with high performance presented in this invention has features of excellent processing compatibility with CMOS fabrication, easy realization of device structure, easy monolithic integration with circuit, high responsivity and detection rate, and also can be widely and practically used in temperature sensors, gas sensors, thermal flow meters and other sensing devices and systems.

What is claimed is:
1. A high performance MEMS thermopile infrared (IR) detector, comprising:
a substrate, wherein:
a releasing barrier band formed on the substrate;
a thermal isolation chamber formed in the releasing barrier band;
a black silicon-based IR absorber disposed above the thermal isolation chamber;
the black silicon-based IR absorber set on the releasing barrier band;
a number of thermocouples set around lateral sides of the black silicon-based IR absorber;
the thermocouples around the black silicon-based IR absorber are electrically connected in series to form a thermopile;
metallic electrodes are set beside the thermopile to output electrical signals;
one-side terminals of the thermopile adjacent to the IR absorber form the hot junctions and the other-side terminals far away from the IR absorber form the cold junctions;
the cold junctions of the thermopile are connected to the substrate through the first thermal-conductive-electrical-isolated structures as well as the heat conductor under the first thermal-conductive-electrical-isolated structures;

the heat conductor is located outside the thermal isolation chamber but between the releasing barrier band and the substrate;

the first thermal-conductive-electrical-isolated structures are embedded in the releasing barrier band;

the hot junctions of the thermopile are in contact with the IR absorber through the second thermal-conductive-electrical-isolated structures; and the second thermal-conductive-electrical-isolated structures are located above the releasing barrier band.

2. The high performance MEMS thermopile IR detector according to claim 1, wherein:

the black silicon-based IR absorber comprises black silicon structures formed from black silicon material through reactive ion etching and releasing channels that run through the black silicon-based IR absorber; and the releasing channels and the thermal isolation chamber are connected with each other.

3. The high performance MEMS thermopile IR detector according to claim 1, wherein:

the thermopile comprises P-type thermocouple strips and the N-type thermocouple strips corresponding to the P-type thermocouple strips;

the N-type thermopile strips and P-type thermocouple strips are isolated from each other by means of the barrier isolation layer;

the P-type thermocouple strips and N-type thermocouple strips are electrically connected through the first connecting lines at the terminals that form hot junctions; and at the terminals that form cold junctions, the P-type thermocouple strips are electrically connected to N-type thermocouple strips and N-type thermocouple strips in adjacent thermocouples are electrically connected through the second connecting lines, such that thermocouples are electrically connected with each other for forming a thermopile.

4. The high performance MEMS thermopile IR detector according to claim 1, wherein:

material for both the first thermal-conductive-electrical-isolated structures and the second thermal-conductive-electrical-isolated structures includes $Si_3N_4$.

5. The high performance MEMS thermopile IR detector according to claim 1, wherein:

metallic electrodes are set beside the serially connected thermocouples around the lateral sides of the black silicon-based IR absorber.

6. The high performance MEMS thermopile IR detector according to claim 3, wherein:

the N-type thermocouple strips are under the P-type thermocouple strips, the N-type thermopile strips are above the releasing barrier band, the cold junctions of the N-type thermocouple strips contact with the first thermal-conductive-electrical-isolated structures and then connect with heat conductor through the first thermal-conductive-electrical-isolated structures;

the hot junctions of the N-type thermocouple strips are bridging one-side terminals of the second thermal-conductive-electrical-isolated structures, and the other-side terminals of the second thermal-conductive-electrical-isolated structures are in contact with the black silicon-based IR absorber.

7. A fabrication method for a high performance MEMS thermopile infrared (IR) detector, comprising:

(a) providing a substrate and setting a substrate protective layer on the surface of the substrate;

(b) etching the substrate protective layer selectively, so as to form substrate contacting windows above the substrate, wherein the substrate contacting windows run through the substrate protective layer;

(c) depositing a layer of heat conductor over the substrate contacting windows, and depositing a mask layer for the heat conductor, wherein the heat-conductor mask layer covers the substrate protective layer and fills in the substrate contacting windows;

(d) etching the heat-conductor mask layer selectively so as to form heat-conductor etching windows, wherein the heat-conductor etching windows run through the heat-conductor mask layer along the inner sides of the substrate contacting windows, and using the heat-conductor etching windows to etch the heat conductor till reaching the substrate protective layer to form heat-conductor through-holes;

(e) depositing a supporting layer on the heat-conductor mask layer, making the supporting layer fill in the heat-conductor through-holes and heat-conductor etching windows and also cover the heat-conductor mask layer so as to form a releasing barrier band structure and the supporting membrane above the substrate;

(f) etching the supporting layer selectively so as to form thermal-conductive-electrical-isolated openings within the supporting layer, wherein the thermal-conductive-electrical-isolated openings run through the supporting layer and locate at the lateral side of the releasing barrier band structure, and depositing a thermal-conductive-electrical-isolated layer over the supporting layer, wherein the thermal-conductive-electrical-isolated layer fills in the thermal-conductive-electrical-isolated openings and covers the supporting layer;

(g) etching the thermal-conductive-electrical-isolated layer so as to form the first thermal-conductive-electrical-isolated blocks and the second thermal-conductive-electrical-isolated blocks at the position of the above mentioned supporting layer, wherein the first thermal-conductive-electrical-isolated blocks are within the supporting layer and the second thermal-conductive-electrical-isolated blocks are over the supporting layer;

(h) setting the first thermocouple strips and the second thermocouple strips between the first thermal-conductive-electrical-isolated blocks and the second thermal-conductive-electrical-isolated blocks close to them, wherein the implantation types for the first thermocouple strips and the second thermocouple strips are different, the first thermocouple strips and the second thermocouple strips are isolated from each other by the barrier isolating layer, the terminals at one side of the first thermocouple strips are in contact with the first thermal-conductive-electrical-isolated blocks and the other-side terminals are in contact with the second thermal-conductive-electrical-isolated blocks;

(i) setting a thermocouple protective layer over the second thermocouple strips, wherein the region covered by the thermocouple protective layer comprises the second thermocouple strips and the first thermal-conductive-electrical-isolated blocks; the black silicon material is formed within the region constructed by the second thermal-conductive-electrical-isolated blocks; and the black silicon material is in contact with the second thermal-conductive-electrical-isolated blocks;

(j) etching the thermocouple protective layer selectively, so as to form electrical-connection through-holes for purpose of connecting the first thermocouple strips and the second thermocouple strips;

(k) sputtering a metal layer on the substrate with produced electrical-connection through-holes, wherein the metal layer is filled in the electrical-connection through-holes; masking and etching the metal layer selectively and making the first thermocouple strips be electrically connected to the second thermocouple strips at one terminals of the second thermal-conductive-electrical-isolated blocks through the first connecting lines; making the second thermocouple strips be electrically connected to the first thermocouple strips of the adjacent thermocouple through the second connecting lines; forming the first electrical connectors at the lateral sides of the first thermal-conductive-electrical-isolated structures;

(l) depositing a passivation layer on the surface of substrate, on which the first connecting lines, the second connecting lines and the first electrical connectors have been produced, wherein the passivation layer covers the black silicon material, the thermocouple protective layer, the first connecting lines, the second connecting lines as well as the first electrical connectors;

(m) etching the passivation layer selectively, so as to form black silicon etching windows on the passivation layer over the black silicon material; etching the black silicon material with help of the black silicon etching windows, till reaching heat conductor right under the black silicon etching windows to form releasing openings;

(n) releasing the heat conductor right under the black silicon material using the releasing barrier band structure as an etching stop, thus to obtain a thermal isolation chamber;

(o) using the passivation layer as the sidewall material for the black silicon material with rough surface; and applying RIE on the black silicon material so as to form the black silicon-based IR absorber and, at the same time, to form the second electrical connector.

8. The fabrication method according to claim 7, wherein:
in the steps (m) and (n), coating the inner walls of the releasing openings with a releasing barrier layer for protecting the black silicon material.

9. The fabrication method according to claim 7, wherein:
in the step (h), the first thermocouple strips are N-type implanted and the second thermocouple strips are P-type implanted.

10. The fabrication method according to claim 7, wherein:
in the step (k), the material of the metal layer includes Al.

\* \* \* \* \*